(12) United States Patent
Brandes

(10) Patent No.: US 8,120,240 B2
(45) Date of Patent: Feb. 21, 2012

(54) LIGHT EMISSION DEVICE AND METHOD UTILIZING MULTIPLE EMITTERS

(75) Inventor: George R. Brandes, Raleigh, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 12/419,896

(22) Filed: Apr. 7, 2009

(65) Prior Publication Data
US 2009/0195137 A1    Aug. 6, 2009

Related U.S. Application Data

(63) Continuation of application No. 11/032,363, filed on Jan. 10, 2005, now Pat. No. 7,564,180.

(51) Int. Cl.
*H01L 33/08* (2010.01)
(52) U.S. Cl. .......... 313/501; 313/498; 362/800
(58) Field of Classification Search .......... 313/498, 313/501–503, 498.501; 362/800
See application file for complete search history.

(56) References Cited

U.S. PATENT DOCUMENTS

| | | | |
|---|---|---|---|
| 3,805,937 A | 4/1974 | Hatanaka et al. |
| 3,875,456 A | 4/1975 | Kano et al. |
| 3,927,290 A | 12/1975 | Denley |
| 4,120,026 A | 10/1978 | Tsuchihashi et al. |
| 4,325,146 A | 4/1982 | Lennington |
| 4,408,157 A | 10/1983 | Beaubien |
| 4,420,398 A | 12/1983 | Castino |
| 4,710,699 A | 12/1987 | Miyamoto |
| 5,087,883 A | 2/1992 | Hoffman |
| 5,264,997 A | 11/1993 | Hutchisson et al. |
| 5,407,799 A | 4/1995 | Studier |
| 5,410,519 A | 4/1995 | Hall et al. |
| 5,477,436 A | 12/1995 | Betling et al. |
| 5,563,849 A | 10/1996 | Hall et al. |
| 5,803,579 A | 9/1998 | Turnbull et al. |
| 5,851,063 A | 12/1998 | Doughty et al. |
| 5,959,316 A | 9/1999 | Lowery |
| 6,066,861 A | 5/2000 | Hohn et al. |
| 6,084,250 A | 7/2000 | Justel et al. |
| 6,095,666 A | 8/2000 | Salam |
| 6,132,072 A | 10/2000 | Turnbull et al. |
| 6,150,774 A | 11/2000 | Mueller et al. |

(Continued)

FOREIGN PATENT DOCUMENTS

DE    3916875 A    12/1990

(Continued)

OTHER PUBLICATIONS

Chhajed, S., "Influence of junction temperature on chromaticity and color-rendering properties of trichromatic whitelight sources", "Journal of Applied Physics", 2005, pp. 1-8, vol. 97.

(Continued)

*Primary Examiner* — Karabi Guharay
(74) *Attorney, Agent, or Firm* — Vincent K. Gustafson; Jenkins, Wilson, Taylor & Hunt

(57) ABSTRACT

A light emission device includes multiple electrically activated solid state emitters (e.g., LEDs) having differing spectral output from one another; and/or phosphor material including one or more phosphors arranged to receive spectral output from at least one of the solid state emitters and to responsively emit a phosphor output, to provide spectral output. In one arrangement, at least four electrically activated solid state emitters each have different spectral outputs in the visible range, with the emitters arranged in an array positioned on a single reflector cup or other support, with at least two solid state emitters differing substantially in size. Aggregated output may include white light having a color temperature in any of several desired ranges.

14 Claims, 7 Drawing Sheets

U.S. PATENT DOCUMENTS

| | | |
|---|---|---|
| 6,212,213 B1 | 4/2001 | Weber et al. |
| 6,234,648 B1 | 5/2001 | Borner et al. |
| 6,252,254 B1 | 6/2001 | Soules et al. |
| 6,255,670 B1 | 7/2001 | Srivastava et al. |
| 6,278,135 B1 | 8/2001 | Srivastava et al. |
| 6,292,901 B1 | 9/2001 | Lys et al. |
| 6,294,800 B1 | 9/2001 | Duggal et al. |
| 6,319,425 B1 | 11/2001 | Tasaki et al. |
| 6,335,538 B1 | 1/2002 | Prutchi et al. |
| 6,337,536 B1 | 1/2002 | Matsubara et al. |
| 6,348,766 B1 | 2/2002 | Ohishi et al. |
| 6,350,041 B1 | 2/2002 | Tarsa et al. |
| 6,357,889 B1 | 3/2002 | Duggal et al. |
| 6,394,621 B1 | 5/2002 | Hanewinkel |
| 6,429,583 B1 | 8/2002 | Levinson et al. |
| 6,441,558 B1 | 8/2002 | Muthu et al. |
| 6,480,299 B1 | 11/2002 | Drakopoulos et al. |
| 6,501,100 B1 | 12/2002 | Srivastava et al. |
| 6,504,179 B1 | 1/2003 | Ellens et al. |
| 6,513,949 B1 | 2/2003 | Marshall et al. |
| 6,522,065 B1 | 2/2003 | Srivastava et al. |
| 6,538,371 B1 | 3/2003 | Duggal et al. |
| 6,550,949 B1 | 4/2003 | Bauer et al. |
| 6,552,495 B1 | 4/2003 | Chang |
| 6,577,073 B2 | 6/2003 | Shimizu et al. |
| 6,592,810 B2 | 7/2003 | Nishida et al. |
| 6,600,175 B1 | 7/2003 | Baretz et al. |
| 6,600,324 B2 | 7/2003 | St-Germain |
| 6,603,258 B1 | 8/2003 | Mueller-Mach et al. |
| 6,608,485 B2 | 8/2003 | St-Germain |
| 6,616,862 B2 | 9/2003 | Srivastava et al. |
| 6,624,350 B2 | 9/2003 | Nixon et al. |
| 6,636,003 B2 | 10/2003 | Rahm et al. |
| 6,642,666 B1 | 11/2003 | St-Germain |
| 6,685,852 B2 | 2/2004 | Setlur et al. |
| 6,686,691 B1 | 2/2004 | Mueller et al. |
| 6,692,136 B2 | 2/2004 | Marshall et al. |
| 6,703,173 B2 | 3/2004 | Lu et al. |
| 6,737,801 B2 | 5/2004 | Ragle |
| 6,744,194 B2 | 6/2004 | Fukasawa et al. |
| 6,762,563 B2 | 7/2004 | St-Germain |
| 6,784,463 B2 | 8/2004 | Camras et al. |
| 6,791,257 B1 | 9/2004 | Sato et al. |
| 6,817,735 B2 | 11/2004 | Shimizu et al. |
| 6,841,804 B1 | 1/2005 | Chen et al. |
| 6,851,834 B2 | 2/2005 | Leysath |
| 6,880,954 B2 | 4/2005 | Ollett et al. |
| 6,882,101 B2 | 4/2005 | Ragle |
| 6,890,085 B2 | 5/2005 | Hacker |
| 6,914,267 B2 | 7/2005 | Fukasawa et al. |
| 6,936,857 B2 | 8/2005 | Doxsee et al. |
| 6,967,116 B2 | 11/2005 | Negley |
| 7,005,679 B2 | 2/2006 | Tarsa et al. |
| 7,008,078 B2 | 3/2006 | Shimizu et al. |
| 7,009,343 B2 | 3/2006 | Lim et al. |
| 7,014,336 B1 | 3/2006 | Ducharme et al. |
| 7,023,019 B2 | 4/2006 | Maeda et al. |
| 7,061,454 B2 | 6/2006 | Sasuga et al. |
| 7,066,623 B2 | 6/2006 | Lee et al. |
| 7,083,302 B2 | 8/2006 | Chen et al. |
| 7,093,958 B2 | 8/2006 | Coushaine |
| 7,095,056 B2 | 8/2006 | Vitta et al. |
| 7,135,664 B2 | 11/2006 | Vornsand et al. |
| 7,164,231 B2 | 1/2007 | Choi et al. |
| 7,207,691 B2 | 4/2007 | Lee et al. |
| 7,213,940 B1 | 5/2007 | Van De Ven et al. |
| 7,215,074 B2 | 5/2007 | Shimizu et al. |
| 7,232,212 B2 | 6/2007 | Iwase |
| 7,239,085 B2 | 7/2007 | Kawamura |
| 7,250,715 B2 | 7/2007 | Mueller et al. |
| 7,255,457 B2 | 8/2007 | Ducharme et al. |
| 7,256,557 B2 | 8/2007 | Lim et al. |
| 7,358,954 B2 | 4/2008 | Negley |
| 7,365,485 B2 | 4/2008 | Fukasawa et al. |
| 7,387,405 B2 | 6/2008 | Ducharme et al. |
| 7,422,504 B2 | 9/2008 | Maeda et al. |
| 7,453,195 B2 | 11/2008 | Radkov |
| 7,473,934 B2 | 1/2009 | Nagai et al. |
| 7,564,180 B2 | 7/2009 | Brandes |
| 2001/0002049 A1 | 5/2001 | Reeh et al. |
| 2002/0070681 A1 | 6/2002 | Shimizu et al. |
| 2002/0087532 A1 | 7/2002 | Barritz et al. |
| 2003/0026096 A1 | 2/2003 | Ellens et al. |
| 2003/0030063 A1 | 2/2003 | Sosniak et al. |
| 2003/0067773 A1 | 4/2003 | Marshall et al. |
| 2003/0146411 A1 | 8/2003 | Srivastava et al. |
| 2003/0222268 A1 | 12/2003 | Yocom et al. |
| 2004/0027481 A1 | 2/2004 | Asai et al. |
| 2004/0046178 A1 | 3/2004 | Sano |
| 2004/0105264 A1 | 6/2004 | Spero |
| 2004/0212998 A1 | 10/2004 | Mohacsi |
| 2004/0218387 A1 | 11/2004 | Gerlach |
| 2004/0252962 A1 | 12/2004 | Ryan |
| 2004/0264193 A1 | 12/2004 | Okumura |
| 2005/0052378 A1 | 3/2005 | Hacker |
| 2005/0231948 A1 | 10/2005 | Pohlert et al. |
| 2005/0259423 A1 | 11/2005 | Heuser et al. |
| 2005/0274972 A1 | 12/2005 | Roth et al. |
| 2006/0012989 A1 | 1/2006 | Lee |
| 2006/0022582 A1 | 2/2006 | Radkov |
| 2006/0060872 A1 | 3/2006 | Edmond et al. |
| 2006/0067073 A1 | 3/2006 | Ting |
| 2006/0105482 A1 | 5/2006 | Alferink et al. |
| 2006/0113548 A1 | 6/2006 | Chen et al. |
| 2006/0120073 A1 | 6/2006 | Pickard et al. |
| 2006/0138435 A1 | 6/2006 | Tarsa et al. |
| 2006/0138937 A1 | 6/2006 | Ibbetson |
| 2006/0149607 A1 | 7/2006 | Sayers et al. |
| 2006/0180818 A1 | 8/2006 | Nagai et al. |
| 2006/0181192 A1 | 8/2006 | Radkov |
| 2006/0245184 A1 | 11/2006 | Galli |
| 2007/0001188 A1 | 1/2007 | Lee |
| 2007/0051966 A1 | 3/2007 | Higashi et al. |
| 2007/0090381 A1 | 4/2007 | Otsuka et al. |
| 2007/0137074 A1 | 6/2007 | Van De Ven et al. |
| 2007/0139920 A1 | 6/2007 | Van De Ven et al. |
| 2007/0139923 A1 | 6/2007 | Negley et al. |
| 2007/0170447 A1 | 7/2007 | Negley |
| 2007/0171145 A1 | 7/2007 | Coleman et al. |
| 2007/0202623 A1 | 8/2007 | Gao et al. |
| 2007/0223219 A1 | 9/2007 | Medendorp, Jr. et al. |
| 2007/0236911 A1 | 10/2007 | Negley |
| 2007/0247414 A1 | 10/2007 | Roberts |
| 2007/0247847 A1 | 10/2007 | Villard |
| 2007/0262337 A1 | 11/2007 | Villard |
| 2007/0263393 A1 | 11/2007 | Van De Ven et al. |
| 2007/0267983 A1 | 11/2007 | Van De Ven et al. |
| 2007/0274063 A1 | 11/2007 | Negley |
| 2007/0274080 A1 | 11/2007 | Negley et al. |
| 2007/0276606 A1 | 11/2007 | Radkov |
| 2007/0278503 A1 | 12/2007 | Van De Ven et al. |
| 2007/0278934 A1 | 12/2007 | Van De Ven et al. |
| 2007/0278974 A1 | 12/2007 | Van De Ven |
| 2007/0279440 A1 | 12/2007 | Negley |
| 2007/0279903 A1 | 12/2007 | Negley |
| 2007/0280624 A1 | 12/2007 | Negley et al. |
| 2008/0084685 A1 | 4/2008 | Van De Ven |
| 2008/0084700 A1 | 4/2008 | Van De Ven |
| 2008/0084701 A1 | 4/2008 | Van De Ven et al. |
| 2008/0088248 A1 | 4/2008 | Myers |
| 2008/0089053 A1 | 4/2008 | Negley |
| 2008/0106895 A1 | 5/2008 | Van De Ven et al. |
| 2008/0106907 A1 | 5/2008 | Trott et al. |
| 2008/0112168 A1 | 5/2008 | Pickard et al. |
| 2008/0112170 A1 | 5/2008 | Trott et al. |
| 2008/0112183 A1 | 5/2008 | Negley |
| 2008/0130265 A1 | 6/2008 | Negley |
| 2008/0130285 A1 | 6/2008 | Negley |
| 2008/0136313 A1 | 6/2008 | Negley et al. |
| 2008/0137347 A1 | 6/2008 | Trott et al. |
| 2008/0170396 A1 | 7/2008 | Yuan et al. |
| 2008/0179602 A1 | 7/2008 | Negley |
| 2008/0192493 A1 | 8/2008 | Villard |
| 2008/0211416 A1 | 9/2008 | Negley et al. |
| 2008/0231201 A1 | 9/2008 | Higley et al. |
| 2008/0259589 A1 | 10/2008 | Van de Ven et al. |
| 2008/0278928 A1 | 11/2008 | Van De Ven et al. |

| | | | |
|---|---|---|---|
| 2008/0278940 | A1 | 11/2008 | Van de Ven et al. |
| 2008/0278950 | A1 | 11/2008 | Pickard et al. |
| 2008/0278952 | A1 | 11/2008 | Trott et al. |
| 2008/0304260 | A1 | 12/2008 | Van de Ven et al. |
| 2008/0304261 | A1 | 12/2008 | Van De Ven et al. |
| 2008/0304269 | A1 | 12/2008 | Pickard et al. |
| 2008/0309255 | A1 | 12/2008 | Myers |
| 2008/0310154 | A1 | 12/2008 | Van De Ven et al. |
| 2009/0002986 | A1 | 1/2009 | Medendorp, Jr. et al. |

FOREIGN PATENT DOCUMENTS

| | | |
|---|---|---|
| EP | 0971421 A2 | 1/2000 |
| EP | 1024399 A1 | 8/2000 |
| EP | 1081771 A2 | 7/2001 |
| EP | 1160883 A2 | 12/2001 |
| EP | 1367655 A1 | 12/2003 |
| EP | 1462711 A1 | 12/2004 |
| EP | 1526057 A2 | 4/2005 |
| EP | 1566848 A2 | 8/2005 |
| EP | 1571715 A | 9/2005 |
| EP | 1760795 A2 | 1/2006 |
| JP | 10-163535 A | 6/1998 |
| JP | 11-163397 A | 6/1999 |
| JP | 2000-022221 A | 1/2000 |
| JP | 2000-022222 A | 1/2000 |
| JP | 2000-183408 A1 | 6/2000 |
| JP | 2001-111114 A1 | 4/2001 |
| JP | 2001-1156331 A | 6/2001 |
| JP | 2001-307506 A | 11/2001 |
| JP | 2002-150821 A1 | 5/2002 |
| JP | 2004-080046 A | 3/2004 |
| JP | 2004103443 A | 4/2004 |
| JP | 2004-253309 A | 9/2004 |
| JP | 2004-356116 A | 12/2004 |
| JP | 2004-363055 A | 12/2004 |
| JP | 2005-005482 A | 1/2005 |
| JP | 2005-057144 A | 3/2005 |
| JP | 2005-101296 A | 4/2005 |
| JP | 2005-142311 A | 6/2005 |
| JP | 2007-122950 A | 5/2007 |
| JP | 2007-141737 A1 | 7/2007 |
| TW | 546854 A | 8/2003 |
| TW | I228837 A | 3/2005 |
| WO | 9843014 A1 | 10/1998 |
| WO | 0034709 A1 | 6/2000 |
| WO | 0169692 A1 | 9/2001 |
| WO | 2004068909 A1 | 8/2004 |
| WO | 2004100611 A1 | 11/2004 |
| WO | 2005004202 A2 | 1/2005 |
| WO | 2005013365 A2 | 10/2005 |
| WO | 2005124877 A2 | 12/2005 |
| WO | 2006028312 A1 | 3/2006 |
| WO | 2007061758 A1 | 5/2007 |

OTHER PUBLICATIONS

Color Kinetics Inc., "Color Quality of Intelligent Solid-State Lighting Systems", "Color Quality of Solid-State Light Sources", Mar. 2005, pp. 1-3.
Color Kinetics Inc., "Color Kinetics Support : White Papers & Presentations; available at http://www.colorkinetics.com/support/whitepapers/", "Solid State Lighting White Papers & Presentations", Feb. 22, 2006, pp. 1-3.
Compound Semiconductors Online, "LED Lighting Fixtures Inc. Sets World Record at 80 Lumens per Watt for Warm White Fixture", "Compound Semiconductors Online", May 30, 2006, p. 1.
Cree Inc., "Cree XLamp 7090 XR-E Series LED: Binning and Labeling", "Cree Inc. Advertisment", 2005, pp. 1-7, Publisher: Cree Inc.
CSA International, "Test Data Report No. 1786317-1", Apr. 20, 2006, pp. 1-15, Publisher: CSA International.
U.S. Department of Energy, "Product Test Reference: CALiPer 7-31 Downlight Lamp", "DOE SSL CALiPer Report", Sep. 2007, pp. 1-21.
U.S. Department of Energy, "Product Test Reference: CALiPer 7-47 Downlight Lamp", "DOE SSL CALiPer Report", Sep. 10, 2007, pp. 1-21.
Krames, M., "Lumileds Lighting, Light from Silicon Valley", "Progress and Future Direction of LED Technology, SSL Workshop", Nov. 13, 2003, pp. 1-21, Publisher: Lumileds Lighting Inc.
LED Lighting Fixtures, "LED Lighting Fixtures Creates 750 Lumen Recessed Light and Uses Only 16 Watts of Power", "Press Release from LED Lighting Fixtures dated Jan. 26, 2006 ", Jan. 26, 2006, p. 1.
LED Lighting Fixtures, "LED Lighting Fixtures Inc., achieves unprecedented gain in light output from new luminaire", "Press Release from LED Lighting Fixtures dated Apr. 24, 2006", Apr. 24, 2006, p. 1.
LED Lighting Fixtures, "LED Lighting Fixtures, Inc., Announces Record Performance", "Press Release from LED Lighting Fixtures dated Feb. 16, 2006", p. 1.
LED Lighting Fixtures, "LED Lighting Fixtures Announces its First LED-based Recessed Down Light ", "Press Release from LED Lighting Fixtures dated Feb. 7, 2007", p. 1.
LED Lighting Fixtures, "LED Lighting Fixtures Inc. Sets World Record at 80 Lumens per Watt for Warm White Fixture", "Press Release from LED Lighting Fixtures dated May 30, 2006", May 30, 2006, p. 1.
Narendran, N. et al., "Color Rendering Properties of LED Light Sources ", 2002, pp. 1-8.
Narendran, N. et al., "Solid State Lighting: Failure Analysis of White LEDS (abstract only)", Jun. 11, 2004, pp. 1-2.
,"White Light LED, Part Nos. NSPW300BS and NSPW312BS, High Brightness LEDs", Nov. 12, 1999, Publisher: Nichia Corporation.
Shimizu, Yoshinori, "Development of High Efficiency LED downlight ", "Proceeding of the First International Conference on White LEDs and Solid State Lighting", Nov. 26, 2007, pp. 1-5.
Unpublished Co-Pending U.S. Appl. No. 12/017,676.
Unpublished Co-Pending U.S. Appl. No. 12/057,748.
Unpublished Co-Pending U.S. Appl. No. 12/146,018.
Unpublished Co-Pending U.S. Appl. No. 12/248,220.
Unpublished Co-Pending U.S. Appl. No. 12/257,804.
Unpublished Co-Pending U.S. Appl. No. 12/277,745.
Unpublished Co-Pending U.S. Appl. No. 12/328,144.
U.S. Appl. No. 60/978,880.
U.S. Appl. No. 60/990,435.
U.S. Appl. No. 60/990,439.
U.S. Appl. No. 60/990,724.
U.S. Appl. No. 61/022,886.
U.S. Appl. No. 61/037,365.
U.S. Appl. No. 61/039,926.
U.S. Appl. No. 61/041,404.
U.S. Appl. No. 61/075,513.
Van De Ven, A. et al., "Warm White Illumination with High CRI and High Efficacy by Combing 455nm Excited Yellowish Phosphor LEDs and . . .", "First International Conference on White LEDs and Solid State Lighting", Nov. 26, 2007, pp. 3-7.
U.S. Department of Energy, "Summary of Results: Round 3 of Product Testing ", "DOE SSL CALiPer Report", Oct. 2007, pp. 1-18.
U.S. Department of Energy, "Summary of Results: Round 4 of Product Testing ", "DOE SSL CALiPer Report", Jan. 2008, pp. 1-18.
U.S. Department of Energy, "Summary of Results: Round 5 of Product Testing ", "DOE SSL CALiPer Report", May 2008, pp. 1-30.
Duggal, A., "Organic Electroluminescence ", edited by Zakya Kafafi, Published: 2005,Chapter 10,pp. 437-466, Publisher: CRC Press.
Sandia National Laboratories, "Light Emitting Diodes (LEDs) for General Illumination: An OIDA Technology Roadmap Update 2 0 0 2 ", Oct. 2002 , Publisher: Optoelectronics Industry Development Association (OIDA), pp. 1-111, available at http://lighting.sandia.gov/lightingdocs/OIDA_SSL_LED_Roadmap_Full.pdf.
TIR Systems Ltd., "Lexel : brillance you can see" LED product Webpage, 2006, pp. 1-3, Publisher: TIR Systems Ltd., available at http://web.archive.org/web/20070106231922/http://tirsys.com/technology/index.htm.
Narukawa, Y. et al., "Ultra-High Efficiency White Light Emitting Diodes", "Japanese Journal of Applied Physics", Oct. 13, 2006, pp. L1084-L1086, vol. 45, No. 41.
Schubert, E. Fred, "Light Emitting Diodes: Chapter 21", 2006, pp. 346-366, Publisher: Cambridge University Press.
Zukausakas, A. et al., "Introduction to Solid State Lighting ", 2002, pp. 118-122, Publisher: John Wiley and Sons.

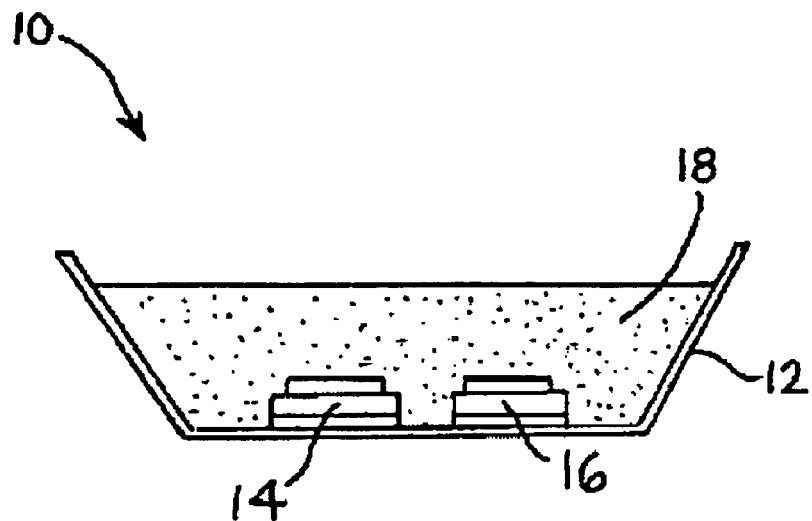
FIG. 1
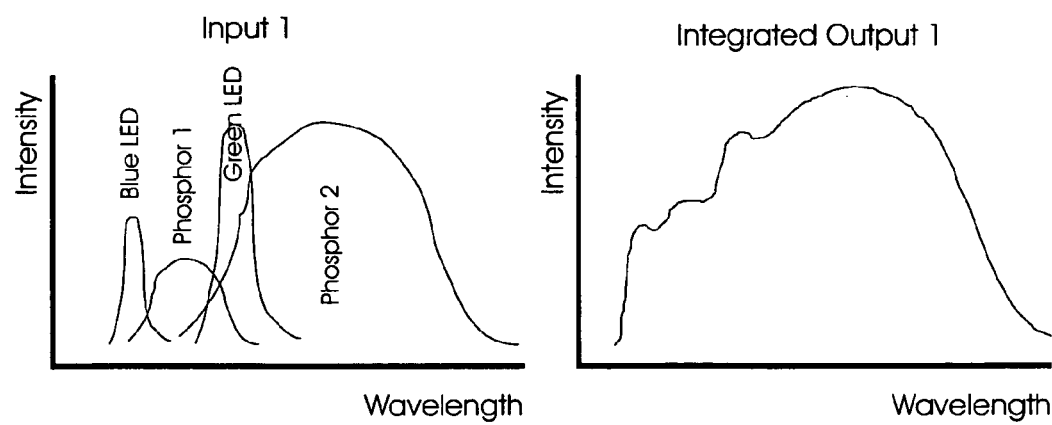
FIG. 2  FIG. 3

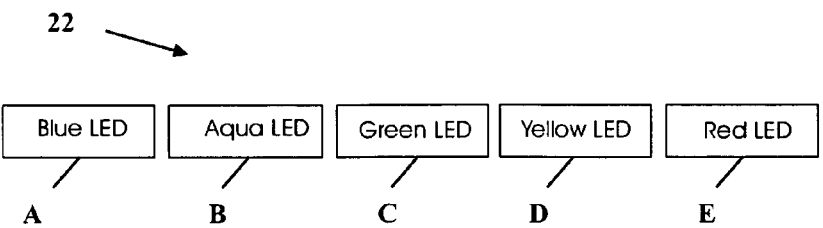
FIG. 4
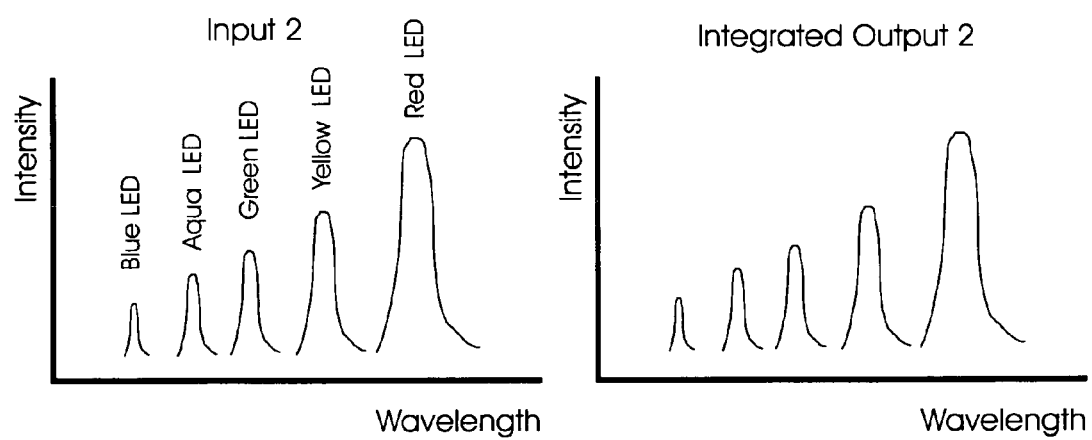
FIG. 5  FIG. 6

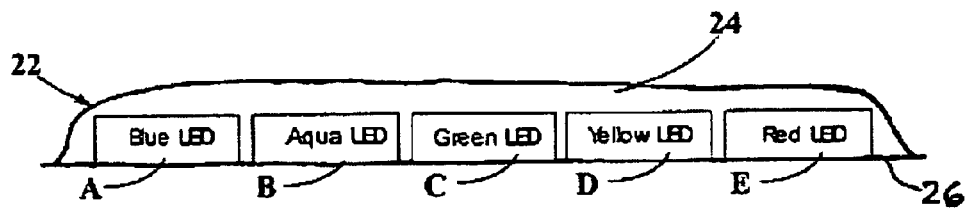
FIG. 7
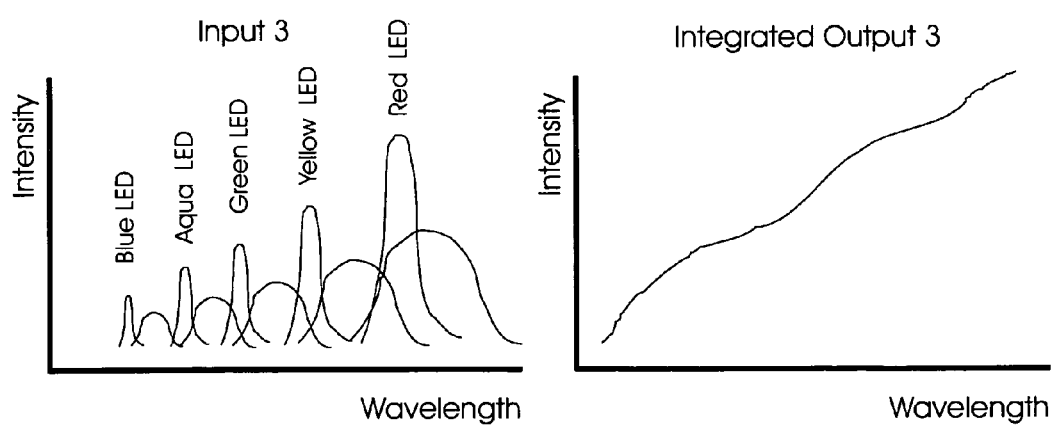
FIG. 8  FIG. 9

US 8,120,240 B2

LIGHT EMISSION DEVICE AND METHOD UTILIZING MULTIPLE EMITTERS

STATEMENT OF RELATED APPLICATIONS

This is a continuation of U.S. patent application Ser. No. 11/032,363 filed on Jan. 10, 2005, now U.S. Pat. No. 7,564, 180 of which benefit of such filing is claimed under 35 U.S.C. 120. The disclosure of the foregoing application is hereby incorporated by reference as if set forth fully herein.

BACKGROUND OF THE INVENTION

1. Field of the Invention

This invention relates generally to light emission devices incorporating multiple solid state emitters (e.g., light emitting diodes (LEDs)) and/or multiple phosphors as emissive components.

2. Description of the Related Art

In the illumination art, a variety of approaches have been employed to produce light of desired spectral character.

LEDs have come into widespread usage as a result of their advantages, which include small size, long life, low energy consumption, and low heat generation.

U.S. Pat. No. 6,513,949 issued Feb. 4, 2003 describes a hybrid lighting system for producing white light, including at least one LED and a phosphor-LED, in which the color and number of the LEDs and/or the phosphor of the phosphor-LED may be varied.

U.S. Pat. No. 6,600,175 issued Jul. 29, 2004 describes a light emitting assembly including an LED emitting a first, relatively shorter wavelength radiation, and a down-converting luminophoric medium, e.g., phosphoric medium, that in exposure to such first radiation, responsively emits a second, relatively longer wavelength radiation.

White LED devices have been commercialized that utilize a blue LED and a YAG phosphor ($Y_3Al_5O_{12}$ doped with cerium) that partially absorbs blue radiation (centered on 470-480 nm) from the blue LED and emits light having a broad wavelength range with a dominant yellow characteristic (centered on ~550-600 nm).

The commercially available LED/phosphor devices for production of white light do not provide high conversion efficiency color rendering in various spectral regimes of interest. For example, in many applications, consumers prefer white light having color (as quantifiable by color temperature and color rendering index values) that matches sunlight, conventional incandescent bulb light, or fire light such as candle light.

There is accordingly a continuing need in the art for efficient LED/phosphor illumination systems producing light having a color rendering that closely matches a predetermined spectral distribution.

SUMMARY OF THE INVENTION

The present invention relates to light emission devices incorporating light emitting diode (LED) and phosphor components.

In one aspect, the invention relates to a light emission device including at least four electrically activated solid state emitters each having different spectral outputs in the visible range, and adapted to emit an aggregated spectral output having at least four different color peaks in the visible range, wherein the at least four solid state emitters are arranged in an array with each solid state emitter being positioned on a single reflector cup or other support structure, and wherein at least two solid state emitters of the at least four solid state emitters differ substantially in size.

In another aspect, the invention relates to a method of generating light, the method including supplying current to at least four electrically activated solid state emitters each having different spectral outputs in the visible range, and adapted to emit an aggregated spectral output having at least four different color peaks in the visible range, wherein the at least four solid state emitters are arranged in an array with each solid state emitter being positioned on a single reflector cup or other support structure, and wherein at least two solid state emitters of the at least four solid state emitters differ substantially in size.

An additional aspect relates to a light emission device including: at least two LED dies having differing spectral output from one another; and phosphor material including one or more phosphors, arranged to receive spectral output from at least one of the LED dies and to responsively emit a phosphor output as at least part of spectral output of the light emission device.

An additional aspect relates to a method of generating light, including exciting at least two LED dies having differing spectral output from one another, to emit spectral outputs from each of such dies, and impinging the spectral output from at least one of such dies on phosphor material including one or more phosphors, to responsively emit a phosphor output as at least part of spectral output constituting such light.

Other aspects, features and embodiments of the invention will be more fully apparent from the ensuing description and claims.

BRIEF DESCRIPTION OF THE DRAWINGS

FIG. 1 is a sectional elevation view of a light emission device according to one embodiment of the invention.

FIG. 2 is a graph of intensity as a function of wavelength, for each of the LED die elements and phosphors employed in the light emission device of FIG. 1, as isolated components.

FIG. 3 is a graph of intensity as a function of wavelength, for the integrated output of the light emission device of FIG. 1.

FIG. 4 is an LED multiple die array including five different LED die colors (shown as Blue LED, Aqua LED, Green LED, Yellow LED and Red LED).

FIG. 5 is a graph of intensity as a function of wavelength, for each of the LED die elements employed in the FIG. 5 LED array, as isolated components.

FIG. 6 is a graph of intensity as a function of wavelength, as the integrated output of the LED array of FIG. 4.

FIG. 7 is a simplified schematic depiction of a light emission device according to another embodiment of the invention, incorporating an LED multiple die array including five different LED die colors (shown as Blue LED, Aqua LED, Green LED, Yellow LED and Red LED) and a phosphor mixture overlying the multiple die array.

FIG. 8 is a graph of intensity as a function of wavelength, for each of the LED die elements and phosphor species employed in the FIG. 7 light emission device, as isolated components.

FIG. 9 is a graph of intensity as a function of wavelength, as the integrated output of the light emission device of FIG. 7.

DETAILED DESCRIPTION AND PREFERRED EMBODIMENTS OF THE INVENTION

Figure 10:
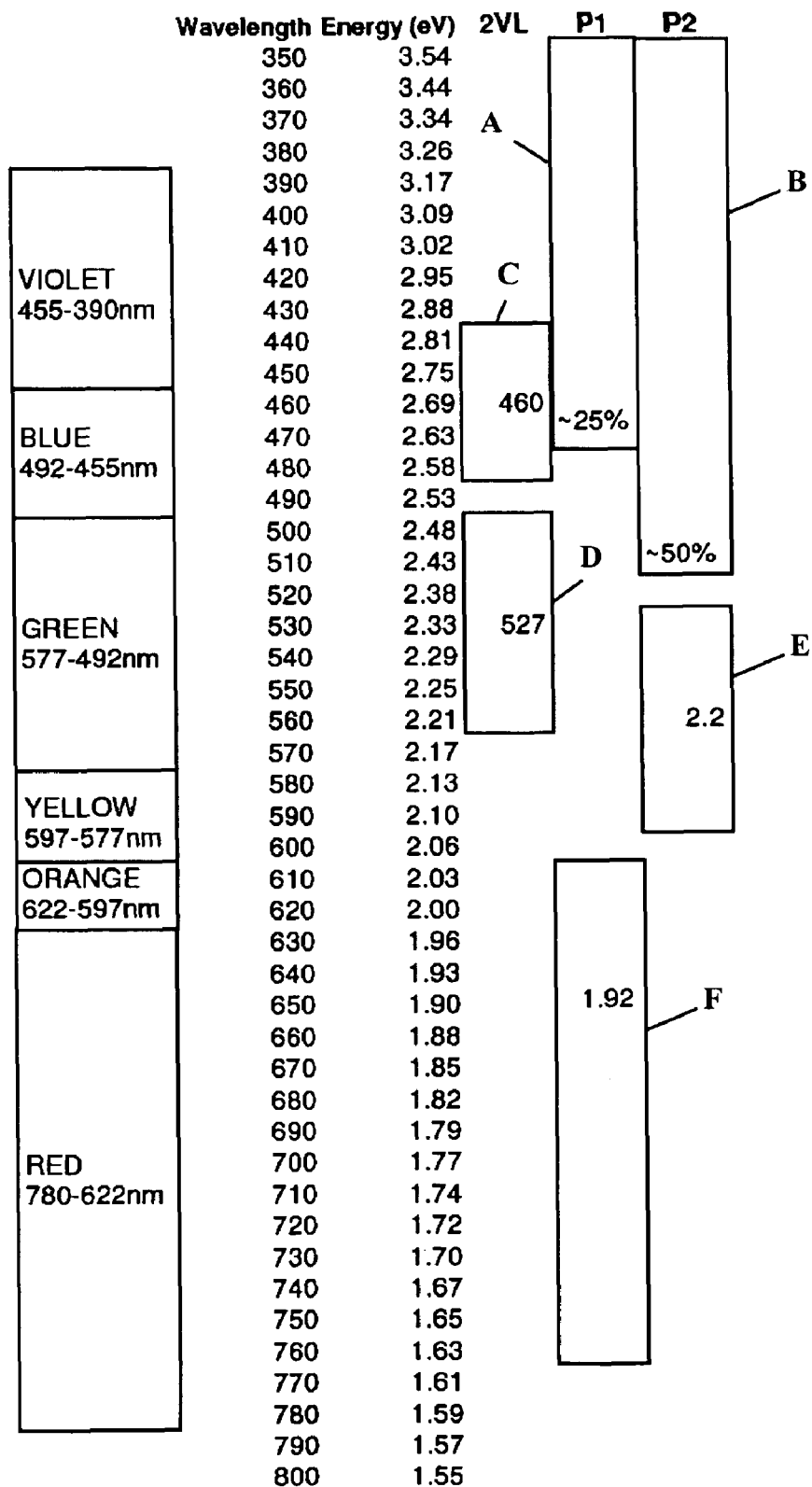
FIG. 10 is a graphical depiction showing wavelength, in nm, and energy, in electron volts, and associated bars showing visible light spectrum, excitation range and spectral region spanned by emission, for a light emission device according to one embodiment of the invention, including two visible light LEDs (green and blue) and two phosphors.

The present invention relates to light emission devices incorporating light emitting diode (LED) and phosphor components.

Light emission devices of the invention enable excellent color rendering to be achieved by the provision of at least two LED dies having differing spectral character from one another, and a phosphor material including one or more phosphors. The phosphor material is arranged to receive energy from at least one of the multiple LED dies and to responsively emit a phosphor output, as at least part of spectral output of the light emission device. The light emission device has a spectral output that differs from the spectral character of each of the LED dies, and that differs from the phosphor output.

By integrating the emissions of the multiple LED dies and the phosphor material containing at least one phosphor component, the light emission device of the invention may be constituted to achieve a superior color rendering that matches predetermined spectral distributions of light, e.g., sunlight, candle light (or other fire), or light produced by incandescent bulbs.

By way of specific example, the light emission device of the invention may be fabricated to provide a white light output having a color temperature in one of the following white light color temperature regimes (A), (B) and (C):

(A) white light having a color temperature in a range of from 1350° K to 1550° K;
(B) white light having a color temperature in a range of from 2400° K to 3550° K;
(C) white light having a color temperature in a range of from 4950° K to 6050° K.

As further specific examples, the color temperature of candles is ~1500° K, the color temperature of incandescent bulbs is ~2680-3000° K, the color temperature of sunrise and sunset is ~3200° K, and the color temperature of a sunny day at noon is ~5500° K. By appropriate selection of LED die components and phosphor species, a close approach to the color temperature of interest can be achieved in the light output of the light emission device.

In various specific embodiments of the invention, such as those illustratively mentioned above, the spectral output of the light emission device can be white light. In other embodiments, the spectral output of the light emission device can be light having a specific color other than white light. In still further embodiments, the spectral output of the light emission device may include output that is outside the visible light spectrum.

The invention achieves superior color rendering at good conversion efficiency, and provides degrees of freedom in light emission device design that permit optimal spectral outputs to be achieved, e.g., of a specific spectral profile, or of a spectral character that is resistant to color change over the service life of the device. In the latter respect, it is known that phosphors and LEDs tend to age, leading to color changes over time. The light emission device of the invention, by virtue of its multiple LED die components and one or more phosphor components, may be fabricated and arranged to compensate for aging of LEDs and/or phosphors.

It is contemplated by the invention to utilize a predetermined combination of LED(s) and phosphor(s) that are matched to one another in their aging profiles so that there is a consistent aging of the overall device during its service life, so that the color of the output light is maintained over the entire service life, albeit possibly changing in intensity as the device ages. In this respect, it is pointed out that the lifetimes of LEDs are typically measured in the tens of thousands of hours, and that the change in output over such period of time may be relatively small as regards the LEDs of the device.

More generally, the invention contemplates the combination of LEDs and phosphors that are selectively matched in the device including same, to achieve a predetermined character of output emission.

It also is contemplated by the invention, in another embodiment thereof, to use a combination of LEDs and phosphors that are matched in the light emission device, to provide a change of color at a predetermined point in the service life of the device. For such purpose, the change of color may be relatively rapid in transition, e.g., to prompt an action on the part of a user or a service technician, such as change-out of the illumination device, or change-out of a battery or other power supply means for such device, or other maintenance or service or other action that is desirably carried out after a period of operation and that is indicatable by a prompting color change.

Although the invention is discussed primarily herein in reference to the generation of a visible illumination output, i.e., in a visible illumination spectrum, the invention nonetheless also is broadly applicable to the generation of emission outputs in non-visible spectral regions, e.g., in an IR spectrum, UV spectrum or other non-visible spectrum.

The light emission device of the invention differs from prior LED-phosphor devices, in the provision of multiple differing LED dies, each associated with the phosphor material in the device.

The phosphor material can contain one or more than one phosphor species, as desired in a specific end use application of the invention.

The phosphor material is stimulated by radiation from LED die element(s) of the light emission device, so as to produce a phosphor output of particular spectral character. The spectral output of the overall device therefore will be a composite radiation that will be "smoothed" or otherwise blended, in relation to a corresponding device with only a single LED die. Individual phosphor species can be selected to absorb all or substantially all of the radiation emitted by a given LED die, or alternatively to absorb only a portion of the incident radiation thereon derived from the LED die while allowing the remainder of the emission from the LED die to transmit unabsorbed from the light emission device.

In one embodiment, the light emission device is provided as a unitary article including the multiple LED dies and phosphor(s) in a protective package, in which the multiple dies are arranged in an array overlaid by the phosphor material. The multiple LED dies can for example be positioned on one or more reflector cups or other support structure, with the phosphor material overlying the dies being provided as a layer of the phosphor material. The phosphor material when including multiple phosphor species can be constituted as a uniform, e.g., substantially homogeneous, mixture of the respective phosphors.

It is contemplated by the invention to shape the phosphor(s) in an overlying coating or mass on the LED(s) so as to match the thickness of the phosphor to the primary emission of the LED(s), so that the primary emission radiation traverses a generally same thickness of the phosphor coating or mass, over the entire periphery or output surfaces of the LED(s), to thereby provide better uniformity of spectral output from the illumination device. The invention also contemplates the shaping of the LED die to provide a directionally enhanced emission of primary radiation, or a more uniform emission of primary radiation than is otherwise achievable in the absence of such LED die shaping. In various embodiments of the invention, therefore, it may be desirable to conformally coat phosphor material(s) on the LED die(s) to achieve a predetermined advantageous character of the light emission device.

The phosphor material may be applied over the multiple dies in any suitable manner, e.g., in a curable liquid formulation that is potted, dip-coated, brushed, rolled, sprayed or otherwise applied over the multiple dies, e.g., to form a layer of the phosphor material in which the phosphor component(s) are homogeneously dispersed in the layer.

It may be desirable in specific applications to place the LED dies in respective individual reflector cups and to mount the cups in a single "bulb" or package. Alternatively, it may be desirable to dispose all LED dies inside a single reflector package. Multiple phosphors may be spread over multiple LED dies or a select phosphor may be spread over a specific LED die. Individual LED die/phosphor packaging may be employed, with each LED die being arranged to impinge emitted energy on a phosphor to produce an integrated output light from the device.

To control the amount of light emitted by the LED dies, current can be sourced individually to each of the dies, if the associated cost and complexity of wiring and power supply arrangements is suitable for the intended end use application. Alternatively, light output of the light emission device can be controlled by variation in die fabrication, die number, die shape, die size (area), contact quality, overall structure resistance, or the like, or other aspects of the LED design.

The phosphor material can be of any suitable type, including for example, YAG (yttrium aluminum garnet) phosphor, $CaGa_2S_4:Eu^{2+}$ phosphor, $ZnGa_2S_4:Mn^{2+}$ phosphor, SrSCu+, Na phosphor, $CaSO_4:Bi$ phosphor or any other suitable type of phosphor material.

The phosphor material may include components other than the phosphor(s) per se, such as a carrier medium in which the phosphor(s) are dispersed. In one embodiment, the carrier medium includes a glass or a polymeric composition that is suitably transmissive of emitted energy, e.g., from the LED die and/or phosphor components, to provide the desired character of light output from the light emission device. Polymeric compositions useful for such purpose may be of any appropriate type, including, without limitation, compositions containing polyolefin, polyimide, polysulfone, polyacrylate, polymethacrylate, polycarbonate, or corresponding copolymers.

The phosphor(s) may be dispersed in the carrier medium in a particulate or other discontinuous form, in an amount ensuring a desired character and extent of conversion of LED die-emitted energy to light output from the phosphor(s) in the carrier medium.

The provision of multiple differing LED dies in a unitary packaging with the phosphor material affords a compact and efficient structure capable of producing a high intensity light output of a desired spectral character. By appropriate selection of the different LED dies and phosphor(s) for the light emission device, the radiative emissions of the respective dies and phosphor(s) can be integrated in a manner achieving close matches to predetermined illumination spectra, such as a spectrum of sunlight, candle light or light emitted by a conventional incandescent filament light bulb.

The selection of LED dies and phosphor(s) thus can be made in a manner that results in small energy differences between the LED dies, as illuminating sources, and phosphor(s) emissively responding to impingement of energy from such dies, so that highly efficient light production is achieved.

The invention will now be described in relation to the drawings, in which FIG. 1 is a sectional elevation view of a light emission device 10 according to one embodiment of the invention. The device 10 is shown in a simplified schematic form for clarity of description and illustration, without depiction of additional light extracting optics, e.g., reflecting surfaces, or focusing lens(es), and without depiction of wiring, package leads, bond structures, power supplies or the like.

The light emitting device 10 includes a reflector cup 12 or similar support structure, on which is mounted an LED die 14 of a first color and an LED die 16 of a second color. In a specific arrangement of such multi-die array, the first LED die 14 is a blue LED die and the second LED die 16 is a green LED die.

The multi-die array is covered with a phosphor material 18, which in a specific embodiment may include a mixture of two phosphors dispersed in a polymeric matrix such as polycarbonate. The phosphors in the phosphor material 18 are appropriately selected to be excited by radiation emitted from the multi-die array and to responsively emit output radiation, so that the integrated output of the light emission device, deriving from the multi-die array and phosphor material, is of a desired spectral character.

FIG. 2 is a graph of intensity as a function of wavelength, for each of the LED die elements and phosphor species employed in the light emission device of FIG. 1, as isolated components. The graph shows the spectral intensity of emissions of the first LED die ("Blue LED"), second LED die ("Green LED"), first phosphor ("Phosphor 1") and second phosphor ("Phosphor 2"), when each of such components is considered individually.

FIG. 3 is a graph of intensity as a function of wavelength, for the integrated output ("Integrated Output 1") of the light emission device of FIG. 1, as including the LED dies and phosphor components whose spectra are shown in FIG. 2. Such integrated output provides a spectral distribution that approximates the spectral distribution of candle light.

FIG. 4 is an LED multiple die array 22 including five different LED die colors. The dies A, B, C, D and E (labeled as "Blue LED," "Aqua LED," "Green LED," "Yellow LED" and "Red LED," respectively) constitute the multiple die array.

FIG. 5 is a graph of intensity as a function of wavelength, for each of the LED dies employed in the FIG. 5 LED die array, as isolated components. The graph shows the spectral intensity of emissions of the first LED die ("Blue LED"), second LED die, ("Aqua LED"), third LED die ("Green LED"), fourth LED die ("Yellow LED") and fifth LED die ("Red LED"), when each of such die components is considered individually.

FIG. 6 is a graph of intensity as a function of wavelength, as the white light integrated output ("Integrated Output 2") of the LED die array of FIG. 4. The integrated light consists of five discrete colors, but there are gaps in the spectral distribution as compared to the spectrum produced by a conventional incandescent filament light bulb.

FIG. 7 is a simplified schematic depiction of a light emission device according to another embodiment of the invention, incorporating an LED multiple die array 22 including five different LED dies A, B, C, D and E (labeled as "Blue LED," "Aqua LED," "Green LED," "Yellow LED" and "Red LED," respectively), as disposed on a support surface 26 and a phosphor mixture 24 overlying the multiple die array.

FIG. 8 is a graph of intensity as a function of wavelength, for each of the LED die elements and phosphor species employed in the FIG. 7 light emission device, as isolated components. The graph shows the spectral intensity of emissions of the first LED die A ("Blue LED"), the second LED die B ("Aqua LED"), the third LED die C ("Green LED"), the fourth LED die D ("Yellow LED") and the fifth LED die E ("Red LED"), as well as the distributions associated with the phosphor material in phosphor mixture 24, when each of such LED die and phosphor components is considered individually.

FIG. 9 is a graph of intensity as a function of wavelength, as the integrated output of the light emission device of FIG. 7. By comparison of the spectral distributions of FIG. 6 and FIG. 9, it is seen that the utilization of the phosphor mixture 24 in the device yields a more smoothly varying spectral distribution that is correspondingly a better spectral match to the desired incandescent bulb spectrum, than the corresponding LED die array lacking the phosphor mixture 24.

The features and advantages of the invention are more fully shown by the following non-limiting examples, as illustrative of specific aspects, features and embodiments of the invention.

Example 1

Light Emission Device Including Two Visible Light LEDs and Two Phosphors

To encompass the desired spectral range, two LEDs, an X-Brite deep blue (having a spectral output centered at 460 nm and extending between ~440 nm and ~480 nm) LED and an X-Brite green (having a spectral output centered at 527 nm and extending between ~500 nm and ~560 nm) LED, both commercially available from Kingbright Corporation, Taipei, Taiwan, are utilized to fabricate a light emission device of the type shown in FIG. 2. The LEDs function as light sources and excite a phosphor mixture including two phosphors. The first phosphor in the phosphor mixture is a $CaGa_2S_4:Eu^{2+}$ phosphor, which emits a yellowish-green light and which is excited with light having a wavelength shorter than 510 nm (~50% absorption). The second phosphor in the phosphor mixture is a $ZnGa_2S_4:Mn^{2+}$ phosphor, which emits an orange-red light and which is excited by light having a wavelength shorter than about ~480 nm (~25% absorption). The die size of each of the two LED dies, and the concentration of each of the two phosphors in the phosphor mixture, are adjusted to achieve a spectral response similar to natural daylight at noon.

FIG. 10 is a graphical depiction showing wavelength, in nm, and energy, in electron volts, and associated bars showing visible light spectrum (at left), excitation spectral ranges (A, B) and emission spectral ranges (C, D, E, F), for a light emission device according to one embodiment of the invention, including two visible light LEDs (green and blue, with emission spectral ranges D and C, respectively) and two phosphors (with emission spectral ranges E and F). In FIG. 10, the bars C, D, E and F show the spectral region covered by emissions of the two LEDs and two phosphors of the device, and bars A and B show the excitation ranges of the two phosphors of the device.

Figure 11:
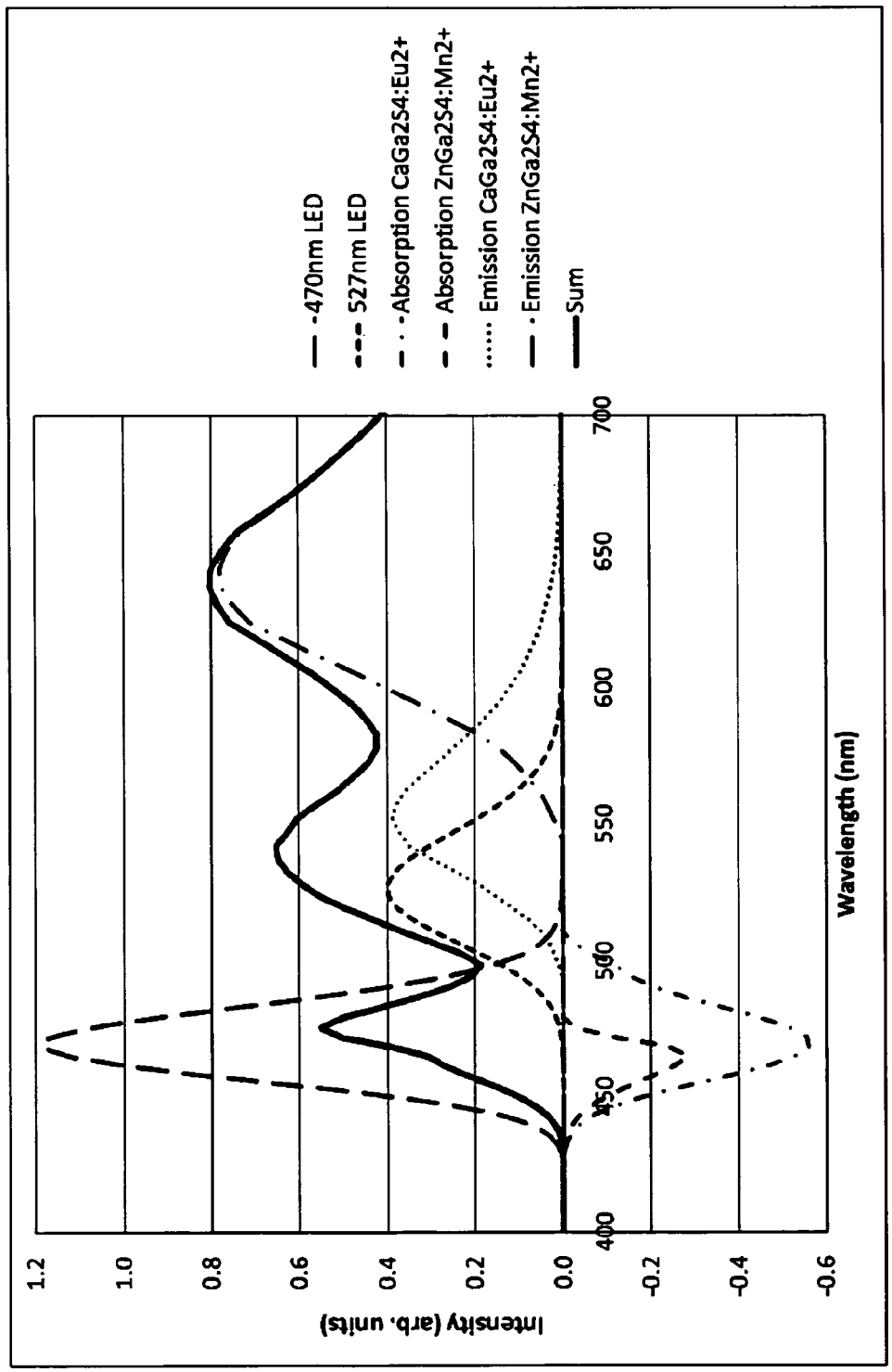
FIG. 11 shows individual emission spectra for a ~470 nm LED (having a spectral output centered at 470 nm), a ~527 nm LED (having a spectral output centered at 527 nm), a $CaGa_2S_4:Eu^{2+}$ phosphor, and a $ZnGa_2S_4:Mn^{2+}$ phosphor; individual absorption spectra for the $CaGa_2S_4:Eu^{2+}$ phosphor and the $ZnGa_2S_4:Mn^{2+}$ phosphor; and an aggregated emission spectral distribution (labeled "Sum") for a combination of the foregoing two LEDs and two phosphors.

FIG. 11 shows individual emission spectra for a very similar device including a ~470 nm LED (i.e., having a spectral output centered at 470 nm), a ~527 nm LED (i.e., having a spectral output centered at 527 nm), a $CaGa_2S_4:Eu^{2+}$ phosphor, and a $ZnGa_2S_4:Mn^{2+}$ phosphor; individual absorption spectra (represented as negative absorption units) for the foregoing two phosphors; and an aggregated emission spectral distribution (labeled "Sum") for the combination of the foregoing two LEDs and two phosphors. The LED emission intensity and the phosphor concentrations have been adjusted to yield the spectral distribution shown in the graph.

Example 2

Blue and Red LEDs with Two Phosphors Excited Only by the Blue

To encompass the desired spectral range, two LEDs, an X-Brite deep blue (460 nm) LED and an X-Brite red (670 nm) LED, both commercially available from Kingbright Corporation, Taipei, Taiwan, are utilized to fabricate a light emission device of the type shown in FIG. 2. The LEDs function as light sources and the blue is used to excite a phosphor mixture including two phosphors. The first phosphor in the phosphor mixture is a SrSCu+,Na phosphor, which emits a green light centered on 530 nm and which is excited with light shorter than ~490 nm (~20% absorption). The second phosphor in the phosphor mixture is a $CaSO_4:Bi$ phosphor, which emits a yellow orange light and which is excited by light shorter than about 510 nm (~10% absorption). The LED dies are coated by the phosphors during manufacture, with all dies being mounted in a single package to facilitate fabrication and assembly. The phosphors are excited by the blue light emitted from the blue LED die, but simply transmit the red light emitted by the red LED die. The die size of each of the two LED dies, and the concentration of each of the two phosphors in the phosphor mixture, are adjusted to achieve a spectral response similar to natural daylight at noon.

Figure 12:
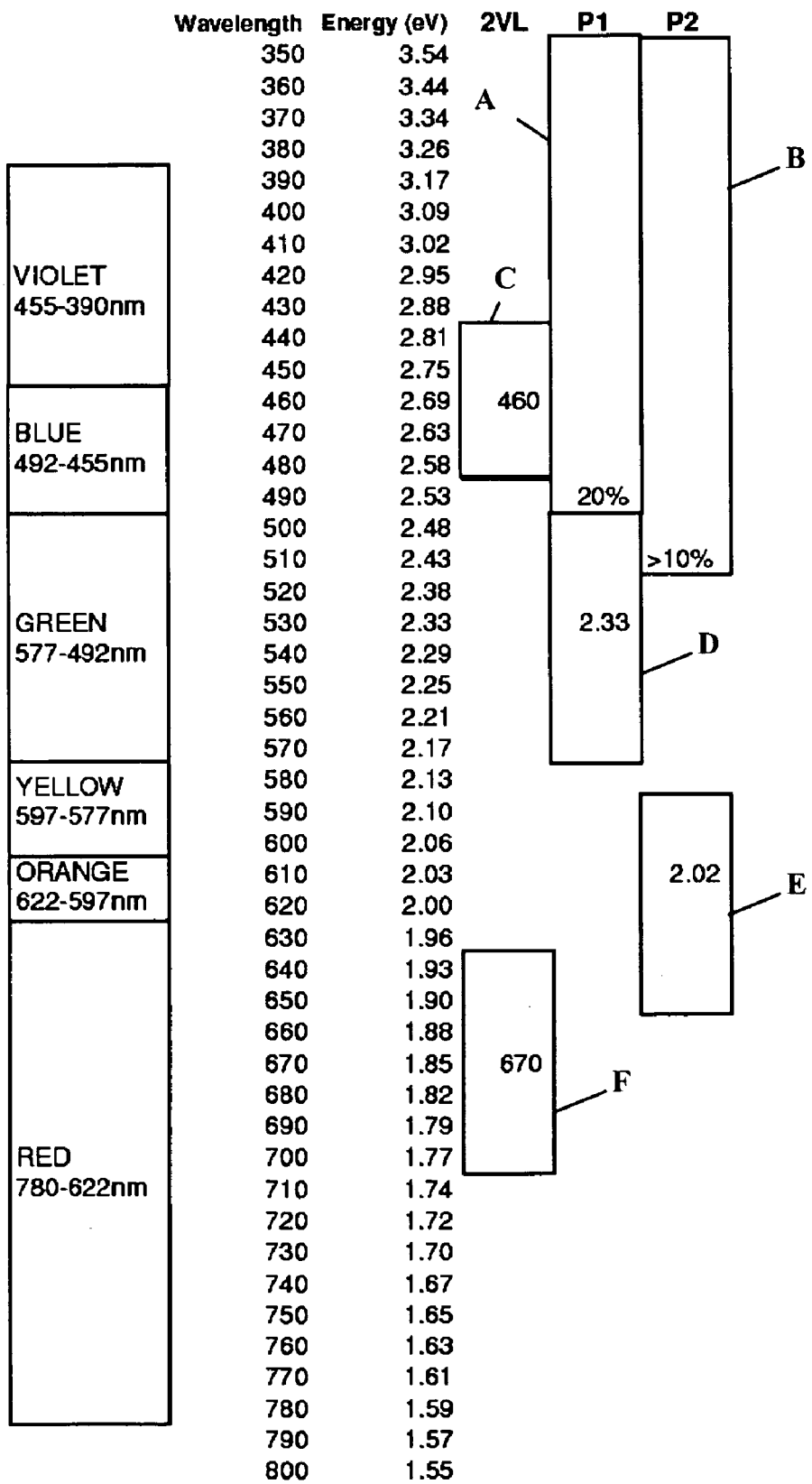
FIG. 12 is a graphical depiction showing wavelength, in nm, and energy, in electron volts, and associated bars showing visible light spectrum, excitation range and spectral region spanned by emission, for a light emission device according to another embodiment of the invention, including two visible light LEDs (blue and red) and two phosphors excited only by the blue LED.

FIG. 12 is a graphical depiction showing wavelength, in nm, and energy, in electron volts, and associated bars showing visible light spectrum, excitation range and spectral region spanned by emission, for the light emission device including the two visible light LEDs (blue and red) and the mixture of two phosphors excited only by the blue LED die emission. In FIG. 11, the bars C, D, E and F show the spectral region covered by the emission from the device, and bars A and B show the excitation range for the device.

Example 3

Ultraviolet and Blue LEDs and One Phosphor

To encompass the desired spectral range approaching a solar spectrum, two LEDs, a MegaBrite ultraviolet (having output centered at 395 nm) LED, commercially available from Cree, Inc., Durham, N.C., USA, and an X-Brite signal green (having output centered at 505 nm) LED, commercially available from Kingbright Corporation, Taipei, Taiwan, are employed to fabricate a light emission device of the general type shown in FIG. 2, in which the phosphor material contains only one phosphor. The ultraviolet LED acts to excite the phosphor while the green LED contributes to the emission to ensure that the spectral distribution produced by the light emission device closely matches the desired solar spectrum. The phosphor employed in the device is a $CaMgSi_2O_6:Eu^{2+}, Mn^{2+}$ phosphor, which emits in the blue, yellow-green, orange and red. This phosphor is transmissive to green and the X-Brite signal green LED produces light in this spectral region. The phosphor is excited by light shorter than 410 nm (~50% absorption). The die size of each of the two LED dies, and the concentration of the phosphor, are adjusted to achieve a spectral response similar to natural daylight at noon.

Figure 13:
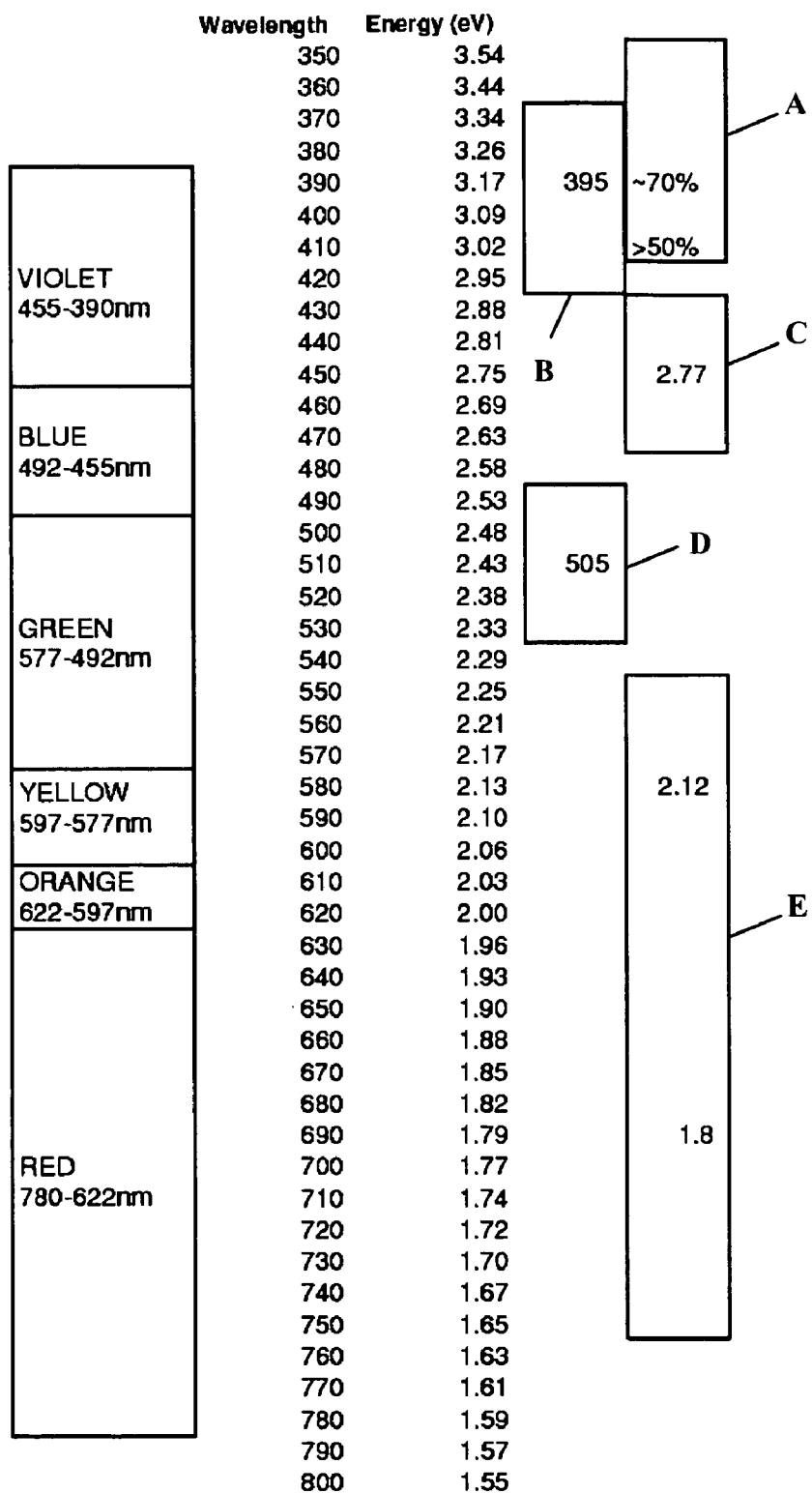
FIG. 13 is a graphical depiction showing wavelength, in nm, and energy, in electron volts, and associated bars showing visible light spectrum, excitation range and spectral region spanned by emission, for a light emission device according to still another embodiment of the invention, including two LEDs (ultraviolet and blue) and one phosphor.

FIG. 13 is a graphical depiction showing wavelength, in nm, and energy, in electron volts, and associated bars showing visible light spectrum, excitation range and spectral region spanned by emission, for such light emission device incorporating two LEDs (ultraviolet and blue) and one $CaMgSi_2O_6:Eu^{2+},Mn^{2+}$ phosphor. In FIG. 12, the bars B, C, D and E show the spectral region covered by the emission from the device, and bar A shows the excitation range for the device.

While the invention has been described herein with reference to specific aspects, features and embodiments, it will be recognized that the invention is not thus limited, but rather extends to and encompasses other variations, modifications and alternative embodiments. Accordingly, the invention is intended to be broadly interpreted and construed to encompass all such other variations, modifications, and alternative embodiments, as being within the scope and spirit of the invention as hereinafter claimed.

What is claimed is:

1. A light emission device comprising at least four electrically activated solid state emitters each having different spectral outputs in the visible range, and adapted to emit an aggregated spectral output having at least four different color peaks in the visible range, wherein the at least four solid state emitters are arranged in an array with each solid state emitter being positioned on a single reflector cup or other support structure, and wherein at least two solid state emitters of the at least four solid state emitters differ substantially in top area.

2. The light emission device of claim 1, wherein the at least four electrically activated solid state emitters comprises a first, a second, a third, and a fourth solid state emitter, and the light emission device further comprises at least one phosphor material arranged to interact with at least one of the first, second, third, and fourth solid state emitter to responsively emit a fifth spectral output including emission in the visible range.

3. The light emission device of claim 2, wherein the at least one phosphor material absorbs only a portion of the output of any solid state emitter of the at least four solid state emitters.

4. The light emission device of claim 2, wherein the at least four electrically activated solid state emitters comprises a first, a second, a third, and a fourth solid state emitter, and wherein the at least one phosphor material is conformally coated over any of the first, second, third, and fourth solid state emitter.

5. The light emission device of claim 2, wherein the at least one phosphor material is disposed over each of the first, second, third, and fourth solid state emitter.

6. The light emission device of claim 2, wherein the at least one phosphor material comprises a plurality of phosphor materials.

7. The light emission device of claim 1, including a covering material comprising at least one of a glass composition and a polymeric composition, wherein said covering material is disposed over each solid state emitter of the at least four solid state emitters.

8. The light emission device of claim 1, adapted to provide an aggregated spectral output of white light.

9. The light emission device of claim 1, adapted to provide white light output having a color temperature in one of the following white light color temperature regimes (A), (B) and (C):

(A) white light having a color temperature in a range of from 1350° K to 1550° K;
(B) white light having a color temperature in a range of from 2400° K to 3550° K; and
(C) white light having a color temperature in a range of from 4950° K to 6050° K.

10. The light emission device of claim 1, wherein current is sourced individually to each solid state emitter of the at least four solid state emitters.

11. The light emission device of claim 1, wherein the at least four solid state emitters comprise at least four LEDs.

12. The light emission device of claim 11, wherein the at least four LEDs are selected from the group consisting of blue LEDs, aqua LEDs, green LEDs, yellow LEDs, and red LEDs.

13. A method of generating light, the method comprising supplying current to at least four electrically activated solid state emitters each having different spectral outputs in the visible range, and adapted to emit an aggregated spectral output having at least four different color peaks in the visible range, wherein the at least four solid state emitters are arranged in an array with each solid state emitter being positioned on a single reflector cup or other support structure, and wherein at least two solid state emitters of the at least four solid state emitters differ substantially in top area.

14. The method of claim 13, wherein current is sourced individually to each solid state emitter of the at least four solid state emitters.

* * * * *